(12) United States Patent
Chou et al.

(10) Patent No.: US 11,335,630 B2
(45) Date of Patent: May 17, 2022

(54) SEMICONDUCTOR PACKAGE SUBSTRATE, ELECTRONIC PACKAGE AND METHODS FOR FABRICATING THE SAME

(71) Applicant: PHOENIX PIONEER TECHNOLOGY CO., LTD., Hsinchu County (TW)

(72) Inventors: Pao-Hung Chou, Hsinchu County (TW); Chun-Hsien Yu, Hsinchu County (TW); Shih-Ping Hsu, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 0 days.

(21) Appl. No.: 16/832,084

(22) Filed: Mar. 27, 2020

(65) Prior Publication Data
US 2020/0312756 A1 Oct. 1, 2020

(30) Foreign Application Priority Data

Mar. 27, 2019 (TW) ................. 108110749

(51) Int. Cl.
*H01L 23/52* (2006.01)
*H01L 23/498* (2006.01)
*H01L 21/48* (2006.01)

(52) U.S. Cl.
CPC .... *H01L 23/49816* (2013.01); *H01L 21/4853* (2013.01); *H01L 23/49838* (2013.01)

(58) Field of Classification Search
CPC .......... H01L 21/4853; H01L 23/49838; H01L 23/49816
USPC ........ 257/757, 668, 774, 778; 438/108, 667, 438/612, 613
See application file for complete search history.

(56) References Cited

U.S. PATENT DOCUMENTS

| | | | |
|---|---|---|---|
| 6,930,032 B2* | 8/2005 | Sarihan | H01L 24/03 438/614 |
| 7,875,805 B2* | 1/2011 | Lin | H05K 1/0271 174/255 |
| 7,968,446 B2* | 6/2011 | Yu | H01L 24/03 438/614 |
| 8,058,568 B2* | 11/2011 | Chang | H05K 3/4602 174/264 |

* cited by examiner

*Primary Examiner* — Luan C Thai
(74) *Attorney, Agent, or Firm* — Amin, Turocy & Watson, LLP

(57) ABSTRACT

A semiconductor packaging substrate and a method for fabricating the same are provided. The method includes forming a solder resist structure having a hole on a circuit structure, with a portion of the circuit structure exposed from the hole, and forming a cup-shaped solder stand on the exposed circuit layer and a hole wall of the hole. During a packaging process, the design of the solder stand increases a contact area of a solder tin ball with a metal material. Therefore, a bonding force between the solder tin ball and the solder stand is increased, and the solder tin ball can be protected from being broken or fell off. An electronic package having the semiconductor packaging substrate and a method for fabricating the electronic package are also provided.

10 Claims, 8 Drawing Sheets

SEMICONDUCTOR PACKAGE SUBSTRATE, ELECTRONIC PACKAGE AND METHODS FOR FABRICATING THE SAME

CROSS-REFERENCE TO RELATED APPLICATIONS

This application claims priority to Taiwan Application Serial No. 108110749, filed on Mar. 27, 2019. The entirety of the application is hereby incorporated by reference herein and made a part of this specification.

BACKGROUND

1. Technical Field

The present disclosure relates to packaging substrates, and, more particularly, to a semiconductor packaging substrate and an electronic package that improve product reliability.

2. Description of the Prior Art

In recent years, the industry has gradually evolved toward packaging specifications for large-sized wafers such as artificial intelligence (AI) chips, high-end wafers, or stacked wafers, such as 3D or 2.5D IC processes, for high-density lines/high transmission speeds/high-end products with stacked/large size designs, such as artificial intelligence (AI) chips, GPUs, etc.

Therefore, the industry has adopted large-sired flip-chip packaging substrates, such as 40*40, 70*70 or other thicker and larger-sized boards to carry large chips, such as AI chips, high-end wafers or stacked wafers.

As shown in FIG. 1A, an electronic device 1 comprises a circuit board 18, a packaging substrate 1a disposed on the circuit board 18, and a semiconductor chip 19 bonded onto the packaging substrate 1a. As shown in FIG. 1B, the packaging substrate 1a comprises a core layer 10, a circuit built-up portion 11 disposed on the core layer 10, and solder resist layers 12a and 12b formed on the circuit built-up portion 11, with the solder resist layers 12a and 12b exposed from the outermost circuit layer of the circuit built-up portion 11 to act as contacts (i.e., I/O) 11a and 11b, respectively. A semiconductor chip 19 is mounted on a top side (e.g., a chip mounting side shown in FIG. 1C) via solder tin bumps 13a, and a circuit board 18 is mounted on a bottom side (e.g., a ball planting side or BGA shown in FIG. 1D) via solder tin balls 13b, to fabricate an electronic package product.

In the formation of the core layer 10, a substrate composed of fiber glass and epoxy resin, such as bismaleimide triazine (BT), flame retardant 4 (FR4) and flame retardant 5 (FR5), is provided. A via forming process, such as a mechanically drilling process, laser drilling process and a bipyramid-shaped via process, is performed on the substrate to form a via, and the via is electroplated with a conductive material and a plugin. The build-up method of the circuit built-up portion 11 uses Ajinomoto build-up film (ABF) as a dielectric layer. The solder resist layers 12a and 12b are made of solder mask or solder resist.

However, the metal contact surface of the solder tin ball 13b with the contact 11b is merely a single surface (e.g., a top surface of the contact 11b). Since the metal contact surface is very small, the solder tin ball 13b is likely broken at the contact 11b, or even fell off from the top surface of the solder tin ball 13" due to the poor bonding force.

As shown in FIG. 1A, in the packaging process of the conventional electronic device 1, when the packaging substrate 1a is applied to a large size, the packaging substrate 1a does not have enough rigidity. Therefore, during a high temperature packaging process, the packaging substrate 1a is likely to have warpage due to the mismatched coefficient of thermal expansion (CTE) of materials between each layer, and is in poor connection with the semiconductor chip 19 (e.g., the solder tin material 13' is not bonded), or in poor connection with the circuit board 18 during soldering (e.g., the solder tin ball 13" is not bonded). Even worse, the semiconductor chip 19 may be malfunction electrically or broken due to the stress.

On the other hand, if the core layer 10 becomes thicker in order to improve the rigidity and reduce the warpage of the packaging substrate 1a, other drawbacks appear. For example, the thicker core layer 10 would run against the compact-size and low-profile requirements for modern packaging designs, and would increase the cost.

Therefore, how to overcome the drawbacks of the prior art is becoming an urgent issue in the art.

SUMMARY

In view of the drawbacks of the prior art, the present disclosure provides a semiconductor packaging substrate, comprising: a circuit structure having a circuit layer; a solder resist structure disposed on the circuit structure and having at least a hole formed therein, with a portion of the circuit layer exposed from the hole; and at least a solder stand being in a cup-shaped structure, formed via electroplating, and extending from an exposed surface of the circuit layer to a hole wall of the hole, wherein the solder stand and the circuit layer are made of same material. In an embodiment, the solder stand and the circuit layer are made of copper.

The present disclosure also provides a method for fabricating a semiconductor packaging substrate, comprising: providing a circuit structure having a circuit layer; forming on the circuit structure a solder resist structure having at least a hole, with the circuit layer exposed from the hole; and forming in the hole at least a solder stand being in a cup-shaped structure, formed via electroplating, and extending from an exposed surface of the circuit layer to a hole wall of the hole, wherein the solder stand and the circuit layer are made of same material.

In an embodiment, the solder resist structure is a single insulating layer.

In an embodiment, the solder stand is in a cup-shaped structure, is formed via electroplating, and extends from an exposed surface of the circuit layer to a hole wall of the hole. In another embodiment, the solder stand and the circuit layer are made of the same material, such as copper.

In an embodiment, the solder resist structure further comprises a metal support layer bonded via a bonding material to the circuit structure and an insulating layer encapsulating the metal support layer.

In an embodiment, the semiconductor packaging substrate further comprises a conductive element disposed on the solder stand, wherein the conductive element is a solder tin ball.

In an embodiment, the semiconductor packaging substrate further comprises a conductively connecting block disposed on the solder stand, wherein the conductively connecting block is a solder tin ball, and the hole is not completely filled with the solder tin ball.

In an embodiment, the semiconductor packaging substrate further comprises a bump bottom portion having an appropriate thickness and formed at a contact portion of the solder stand and the circuit layer, wherein the appropriate thickness is greater than half a depth of the hole and less than the depth of the hole.

The present disclosure further provides an electronic package, comprising: the semiconductor packaging substrate, wherein the circuit layer is formed on a first side and a second side opposing the first side of the circuit structure, and the solder resist structure is disposed on the second side of the circuit structure; and an electronic component disposed on the first side of the circuit structure and electrically connected to the circuit layer on the first side of the circuit structure.

The present disclosure further provides a method for fabricating an electronic package, comprising: providing the semiconductor packaging substrate, wherein the circuit layer is formed on a first side and a second side opposing the first side of the circuit structure, and the solder resist structure is disposed on the second side of the circuit structure; and placing an electronic component on the first side of the circuit structure, and electrically connecting the electronic component to the circuit layer on the first side of the circuit structure.

In an embodiment, the electronic package further comprises an encapsulating layer formed on the semiconductor packaging substrate and bonded to the electronic component and the semiconductor packaging substrate.

In an embodiment, the electronic component is disposed on the first side of the circuit structure via a plurality of conductive bumps.

It is known from the above that in the semiconductor packaging substrate, the electronic package and the methods for fabricating the same according to the present disclosure, the solder stand is formed on the exposed circuit layer and the hole wall of the hole of the solder resist structure. Therefore, the conductive element has a metal contact area increased, and a bonding force between the conductive element (solder tin ball) and the solder stand is increased accordingly. Compared with the prior art, the present disclosure can protect the conductive element from being broken or fell off.

BRIEF DESCRIPTION OF THE DRAWINGS

The present disclosure can be more fully understood by reading the following description of the embodiments, with reference made to the accompanying drawings, wherein:

FIG. 3A' is another aspect of FIG. 3A;

FIGS. 3C' and 3C" are other aspects of FIG. 3C;

FIG. 3D' is another aspect of FIG. 3D.

DETAILED DESCRIPTION

The following illustrative embodiments are provided to illustrate the present disclosure, these and other advantages and effects can be apparently understood by those in the art after reading the disclosure of this specification. The present disclosure can also be performed or applied by other different embodiments. The details of the specification may be on the basis of different points and applications, and numerous modifications and variations can be devised without departing from the spirit of the present disclosure.

The terminology used herein is for the purpose of describing particular devices and methods only and is not intended to be limiting of this disclosure. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of stated features, integers, steps, operations, elements, and/or components, but do not preclude the presence or addition of one or more other features, integers, steps, operations, elements, components, and/or groups thereof.

Figure 1A:
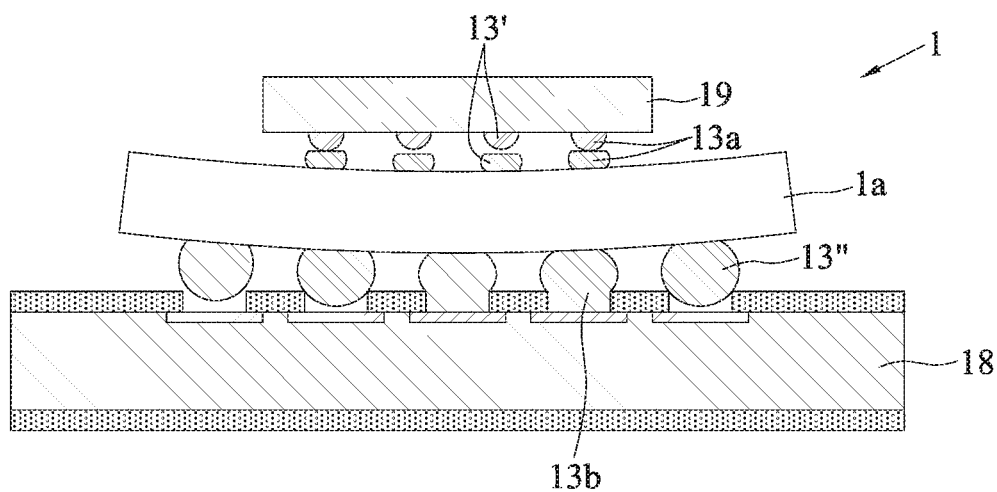
FIG. 1A is a cross-sectional view of an electronic device according to the prior art.
Figure 1B:
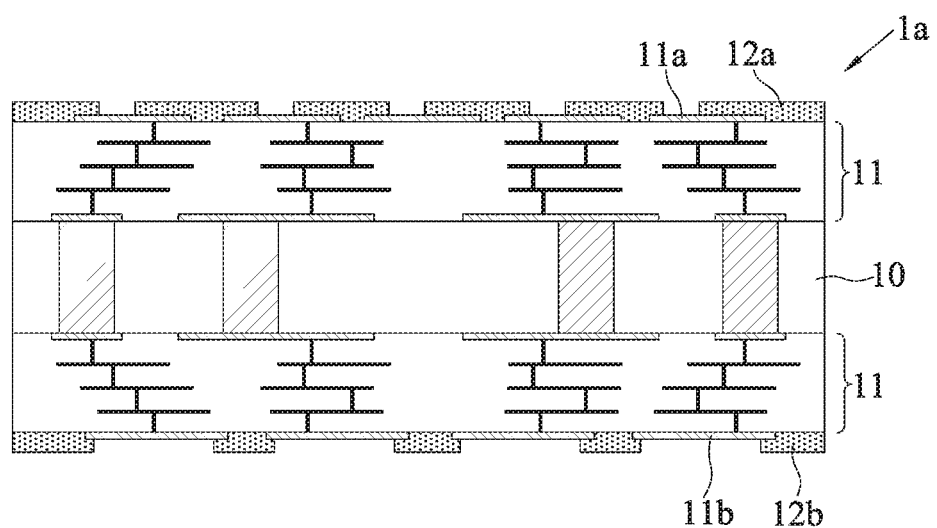
FIG. 1B is a cross-sectional view of a flip-chip packaging substrate according to the prior art.
Figure 1C:
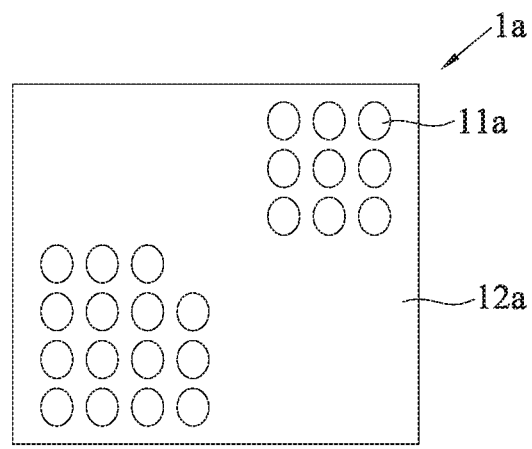
FIG. 1C is a top view of FIG. 1B.
Figure 1D:
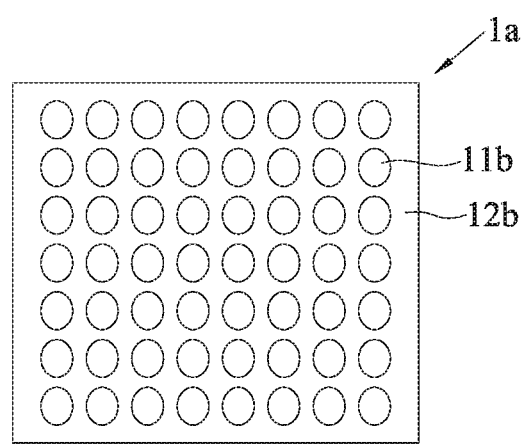
FIG. 1D is a bottom view of FIG. 1B.
Figure 2A:
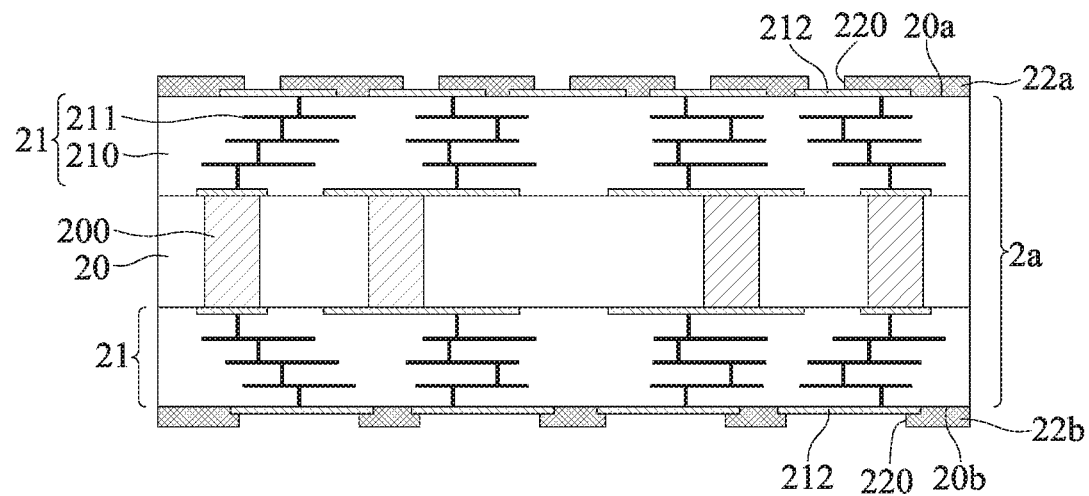
FIGS. 2A and 2B are cross-sectional views illustrating a method for fabricating a semiconductor packaging substrate of a first embodiment according to the present disclosure.
Figure 2B:
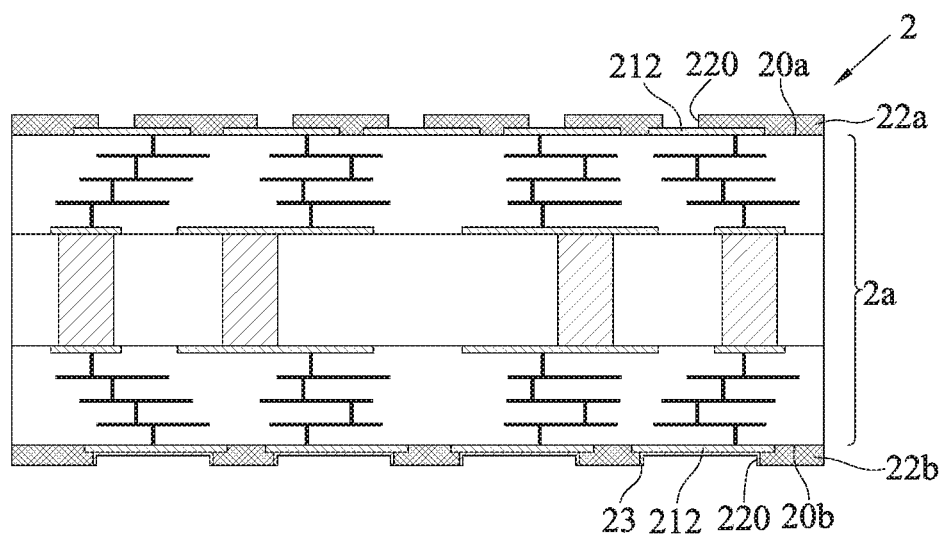

FIGS. 2A and 2B are cross-sectional views illustrating a method for fabricating a semiconductor packaging substrate 2 of a first embodiment according to the present disclosure.

As shown in FIG. 2A, a circuit structure 2a is provided. The circuit structure 2a comprises a first side 20a and a second side 20b opposing the first side 20a, onto both of which an electronic component (e.g., a semiconductor chip, a passive element, etc.) can be mounted. An externally connected side for a semiconductor chip to be mounted thereonto is called a chip-mounting side. In the following, the first side 20a acts as the chip-mounting side.

In an embodiment, the circuit structure 2a has a core layer 20, in which a plurality of conductive portions 200 are formed. In an embodiment, the core layer 20 is formed by a substrate composed of glass fiber and an organic resin, such as bismaleimide triazine (BT), FR4 and FR5. In another embodiment, the core layer 20 is formed by a highly rigid organic substrate having a filler (e.g., SiO2), without glass fiber. A via forming process, such as a mechanically drilling process and a laser drilling process, is performed on the core layer 20 to form a hole, and a conductive material is formed in the hole. In another embodiment, the core layer 20 is formed of an organic insulating material, such as Ajinomoto build-up film (ABF), prepreg with or without glass fiber, and molding compound, such as epoxy molding compound (EMC). In an embodiment, EMC with high rigidity and low CTE is adopted. In an embodiment, the conductive portions 200 can be constituted by a single conductive pillar or a plurality of conductive pillars stacked on one another.

The circuit structure 2a comprises a built-up portion 21 disposed on the core layer 20. The built-up portion 21 comprises at least one dielectric layer 210 and a plurality of circuit layers 211 bonded to the dielectric layer 210. In an embodiment, the dielectric layer 210 is a liquid epoxy resin, an ABF film, a prepreg, EMC or a photosensitive resin. In an embodiment, the number of the circuit layers 211 can be adjusted on demands.

An insulating layer having a plurality of holes 220 is formed on the built-up portion 21 of the circuit structure 2a to act as solder resist structures 22a and 22b. The outermost circuit layer 211 of the circuit structure 2a is exposed from the holes 220 to act as solder pads 212. In an embodiment, the solder resist structures 22a and 22b are made of graphene, solder resist, solder mask, ABF, non-photosensitive dielectric material (e.g., EMC) or other suitable materials.

In another embodiment, the core layer 20 is a silicon substrate, the built-up portion 21 is disposed on the silicon substrate, and the circuit structure 2a becomes a silicon interposer. In yet another embodiment, the circuit structure 2a is in the form of a coreless layer.

As shown in FIG. 2B, solder stands 23 are formed on the solder pads 212 on the second side 20b of the circuit structure 2a and on the hole walls of the holes 220 of the solder resist structure 22b.

In an embodiment, the solder stands 23 and the solder pads 212 are made of the same material, such as copper. In an embodiment, copper is electroplated on the exposed surface of the solder pads 212 of the circuit layer 211 and extends onto the hole walls of the holes 220.

Figure 2C:
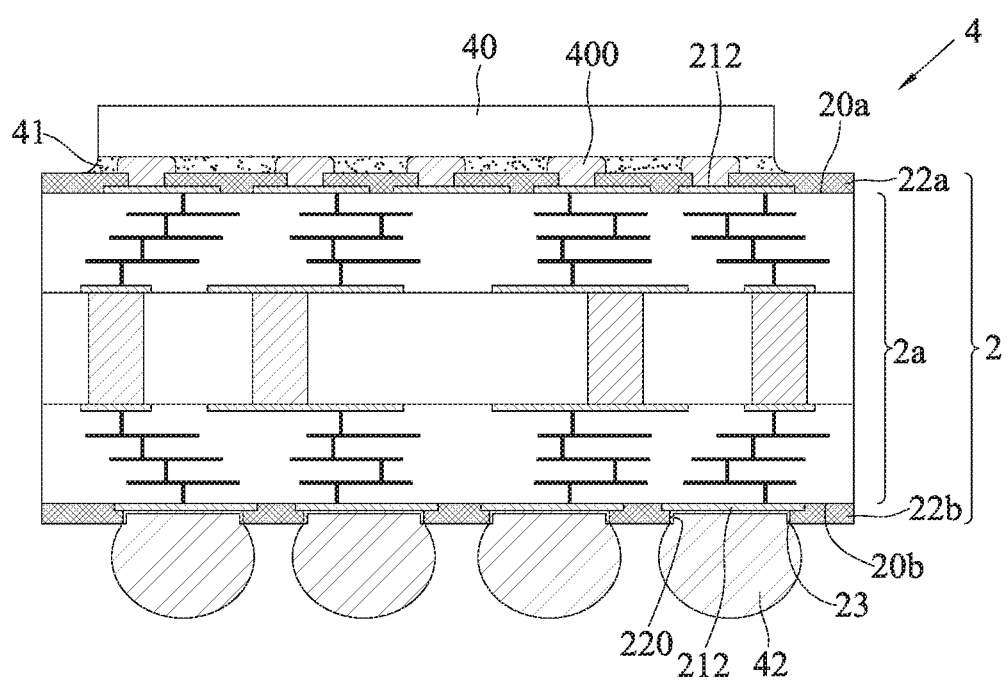
FIG. 2C is a cross-sectional view of an electronic package of the first embodiment according to the present disclosure.

In the subsequent application of the semiconductor packaging substrate 2, as an electronic package 4 shown in FIG. 2C, at least one electronic component 40 is disposed on the exposed solder pads 212 on the first side 20a of the circuit structure 2a, an encapsulating layer 41 is formed on the first side 20a of the circuit structure 2a and bonded to the electronic component 40, and a conductive element 42, such as a solder tin ball, is mounted onto the solder stand 23 on the second side 20b of the circuit structure 2a, for a circuit board (not shown) to be bonded thereto.

In an embodiment, the electronic component 40 is an active element, such as a semiconductor chip, a passive element, such as a resistor, a capacitor or an inductor, or a combination thereof. In an embodiment, the electronic component 40 is a semiconductor chip, and is electrically connected to the solder pads 212 via a plurality of conductive bumps 400 containing solder tin in a flip-chip manner. In another embodiment, the electronic component 40 is electrically connected to the solder pads 212 via a plurality of solder wires (not shown) in a wire bonding manner. The electronic component 40 can be electrically connected to the semiconductor packaging substrate 2 in other manners. In an embodiment, the electronic component 40 is disposed on the second side 20b of the circuit structure 2a or embedded in the built-up portion 21.

In an embodiment, the encapsulating layer 41 is an underfill, and is formed between the first side 20a of the circuit structure 2a and the electronic component 40 to encapsulate the conductive bumps 400. In another embodiment, the encapsulating layer 41 is a thin film used in a compressing process, an encapsulating resin used in a molding process, or a resin material used in a printing process to encapsulate the electronic component 40 and the conductive bumps 400. In an embodiment, the encapsulating layer 41 is formed by polyimide (PI), epoxy resin, or a packaging material for mold sealing. The electronic component 40 can be packaged in other manners.

The conductive element 42 is formed on the solder stands 23.

In an embodiment, the conductive element 42 comprises a solder tin material, such as a solder tin ball.

In the method for fabricating the semiconductor packaging substrate 2 according to the present disclosure, a copper layer (i.e., the solder stands 23) that is made of the same material as the circuit layer 211 and the solder pads 212 is electroplated on the solder pads 212 on the ball planting side (the second side 20b of the circuit structure 2a) and on the hole walls of the holes 220 of the solder resist structure 22b. Therefore, during the subsequent ball planting process, the conductive element 42 (a solder tin ball) will be in contact with the bottom surface and lateral wall of the solder stand 23, a metal contact area between the conductive element 42 and the solder stand 23 is increased, and the bonding force between the conductive element 42 (a solder tin ball) and the solder stand 23 is increased. Compared with the prior art, the present disclosure ensures that the conductive element 42 will not be broken or fell off from the solder stand 23.

Figure 3A:
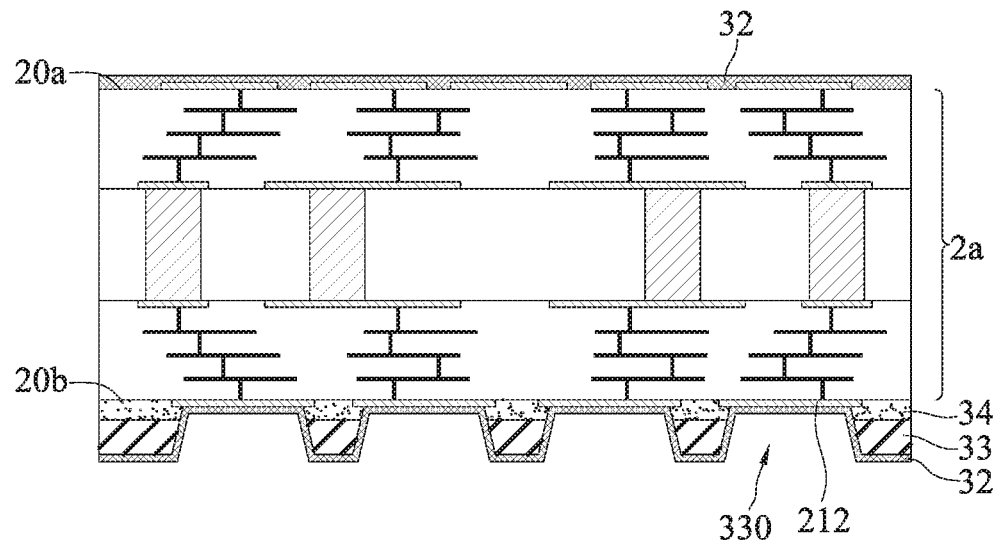
FIGS. 3A to 3C are cross-sectional views illustrating a method for fabricating a semiconductor packaging substrate of a second embodiment according to the present disclosure.
Figure 3A:
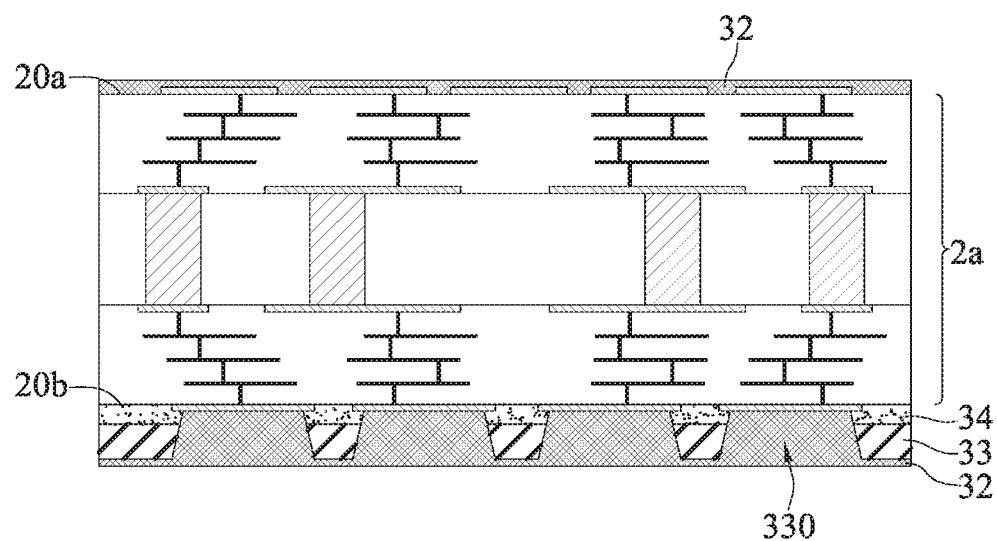
Figure 3B:
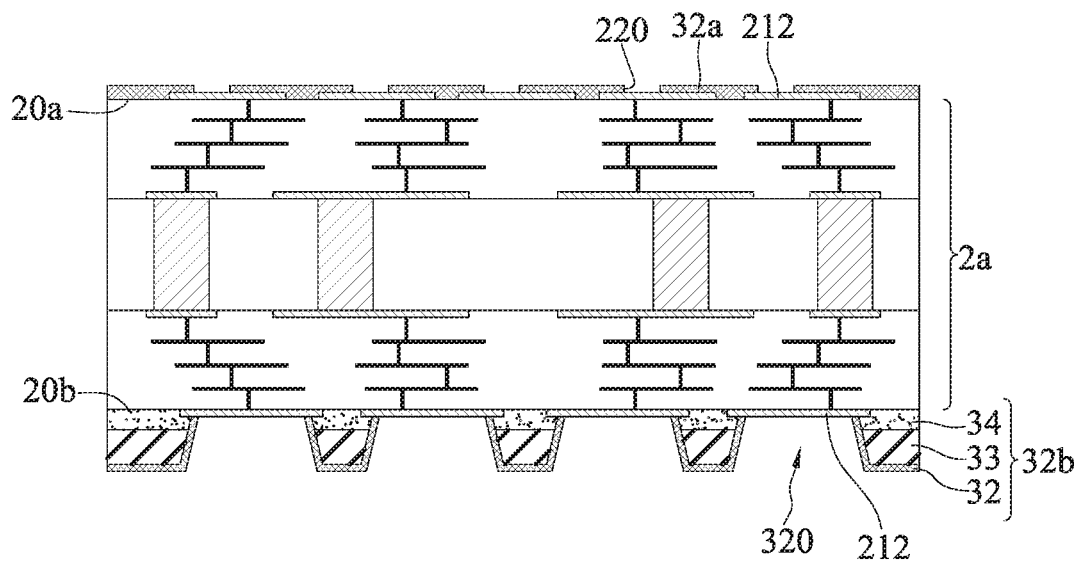
Figure 3C:
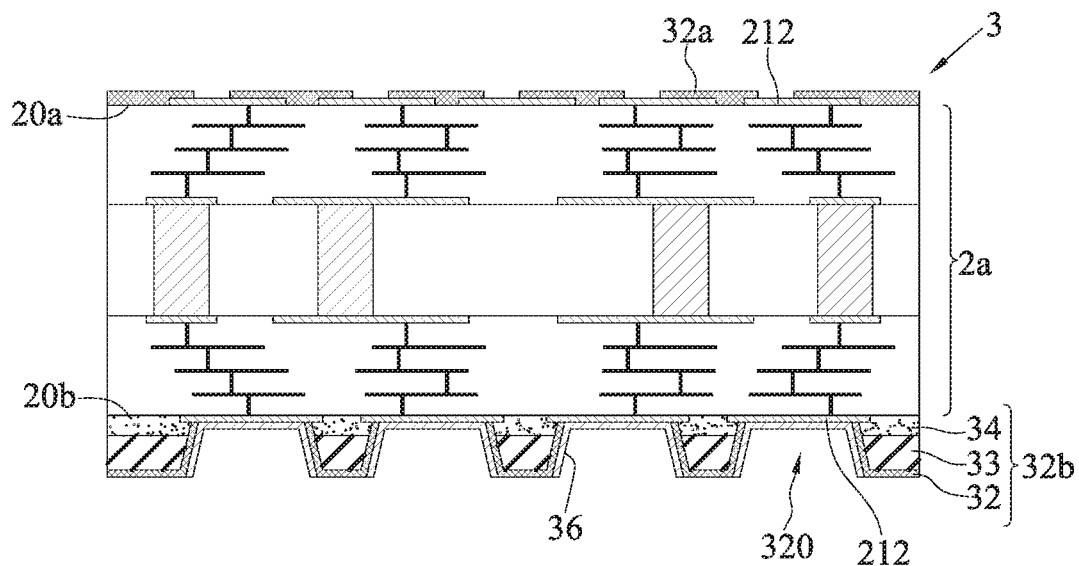
Figure 3C:
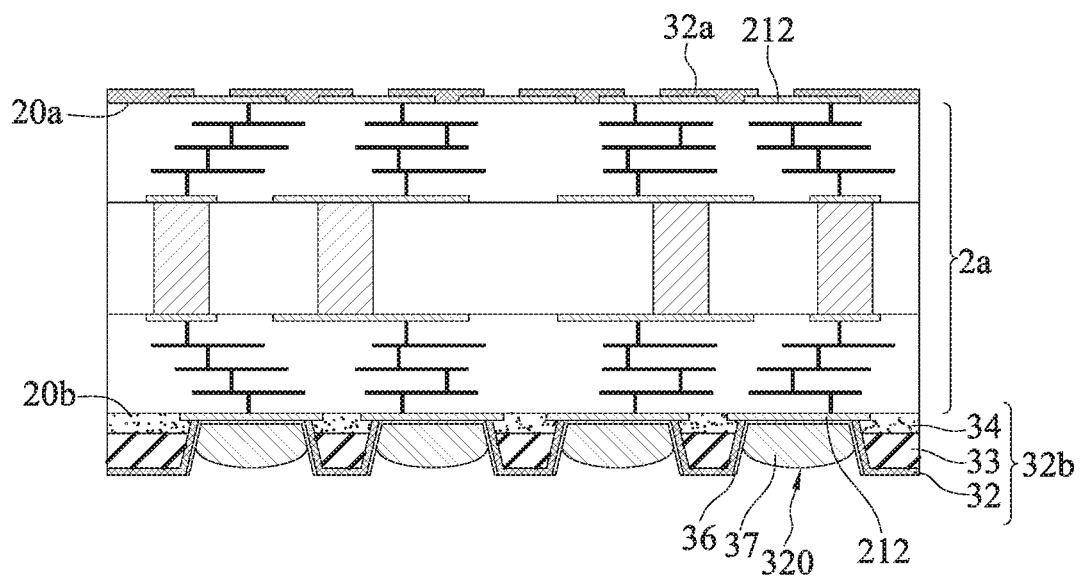
Figure 3C:
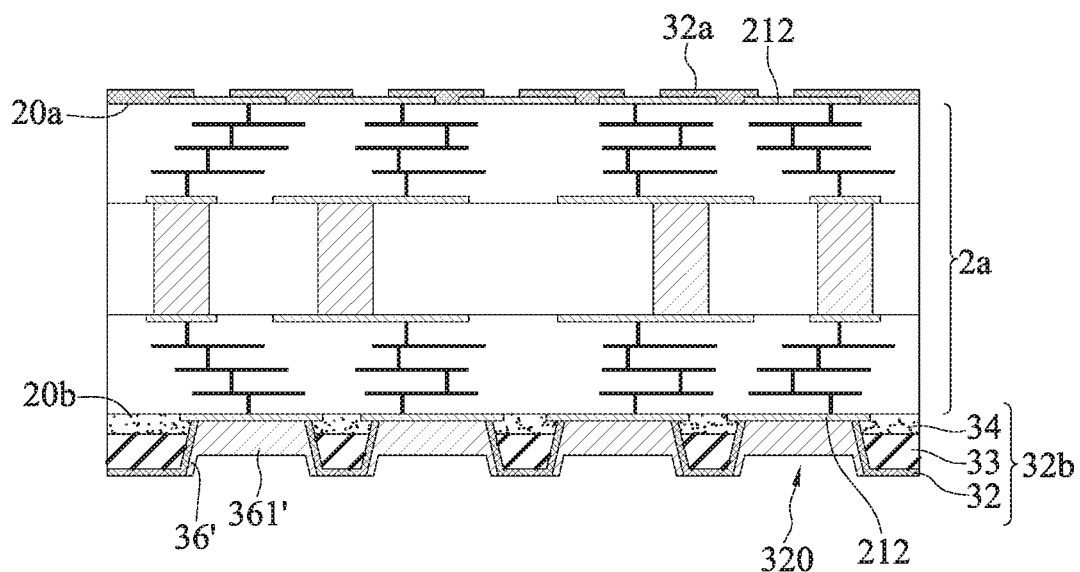

FIGS. 3A to 3C are cross-sectional views illustrating a method for fabricating a semiconductor packaging substrate 3 of a second embodiment according to the present disclosure. The second embodiment differs from the first embodiment in the solder resist structure, which will be described in the following paragraphs.

As shown in FIG. 3A, a metal support layer 33 is bonded via a bonding material 34 to the second side 20b of the circuit structure 2a, a plurality of first holes 330 are formed on the metal support layer 33 and extend through the bonding material 34, and the solder pads 212 are exposed from the first holes 330. An insulating layer 32 is formed on the solder pads 212 and the metal support layer 33 and in the first holes 330.

In an embodiment, the metal support layer 33 is a steel plate or a nickel alloy (an alloy 42) piece, the bonding material 34 is an adhesive resin, and the insulating layer 32 is made of graphene, solder resist, solder mask, ABF, non-photosensitive dielectric material (e.g., EMC), or other suitable materials.

In an embodiment, the insulating layer 32 is formed along the lateral walls of the first holes 330. In another embodiment, the insulating layer 32 fills the first holes 330 completely, as shown in FIG. 3A'.

The insulating layer 32 is also formed on the first side 20a of the circuit structure 2a.

As shown in FIG. 3B, a plurality of second holes 320 are formed on the insulating layer 32 on the second side 20b of the circuit structure 2a, the solder pads 212 are exposed from the second holes 320, the insulating layer 32 and the metal support layer 33 act as the solder resist structure 32a, and the insulating layer 32 encapsulates the metal support layer 33.

As shown in FIG. 3C, the solder stands 36 are formed on the solder pads 212 on the second side 20b of the circuit structure 2a and on the hole walls of the second holes 320 of the solder resist structure 32b, to increase bonding contact area with the conductive element 42 and the bonding force therebetween.

In another embodiment, a conductively connecting block 37 is further formed on the cup-shaped solder stand 36 on demands. In yet another embodiment, the conductively connecting block 37 is made of tin or other metal. As shown in FIG. 3C', a solder tin ball less than the second holes 320 in volume is mounted onto the cup-shaped solder stand 36 to form the conductively connecting block 37. Therefore, the size of the conductive element 42 subsequently mounted is decreased effectively (referring to FIG. 3D) to meet the requirement of fine spacing package.

In an embodiment, a bump bottom portion 361' having an appropriate thickness (e.g., half the depth of the second holes 320) is electroplated on the solder pads 212 in the second holes 320, and extends to the remaining hole walls of the second holes 320, thereby forming a cup-shaped solder stand 36' having the bump bottom portion 361' (which is made of the same material as the circuit layer 211 and the solder pads 212, e.g., copper). Therefore, the size of the conductive element 42 subsequently mounted can be reduced effectively (referring to FIG. 3D'), the requirement of a fine spacing package can be met, and the electric quality can be further optimized (by replacing a portion of the conductive element 42 made of tin with the bump bottom portion 361' made of copper having good electric quality).

Figure 3D:
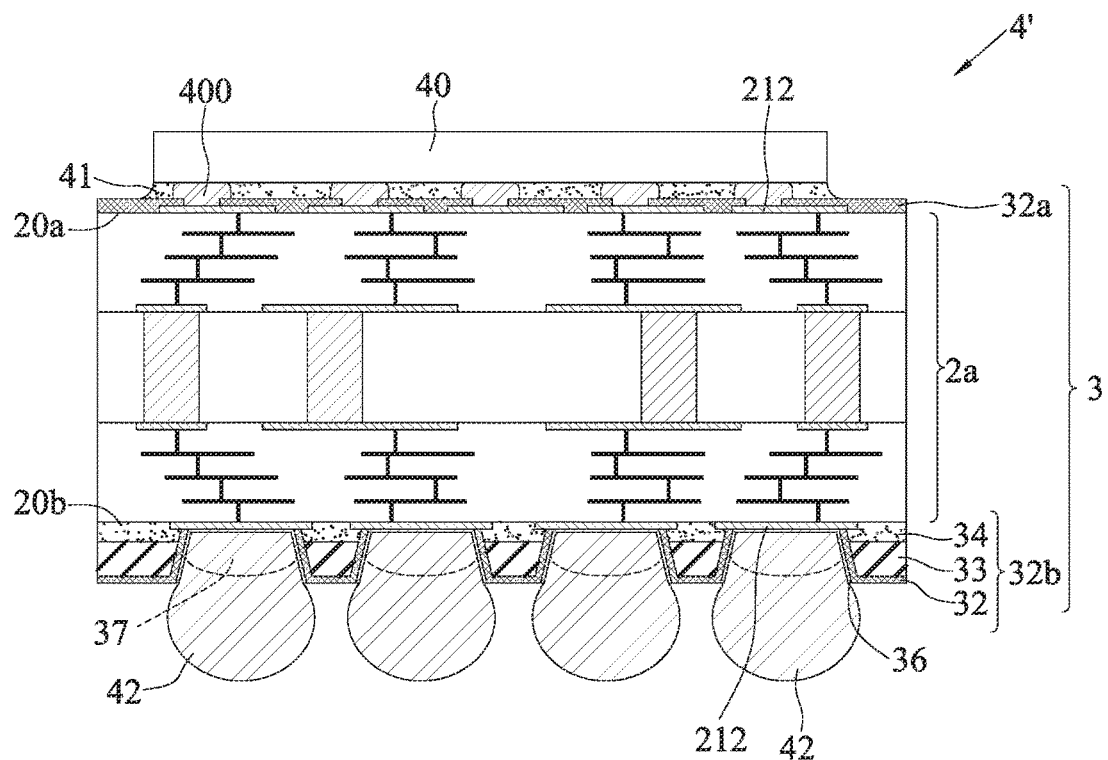
FIG. 3D is a cross-sectional view of an electronic package of the second embodiment according to the present disclosure.
Figure 3D:
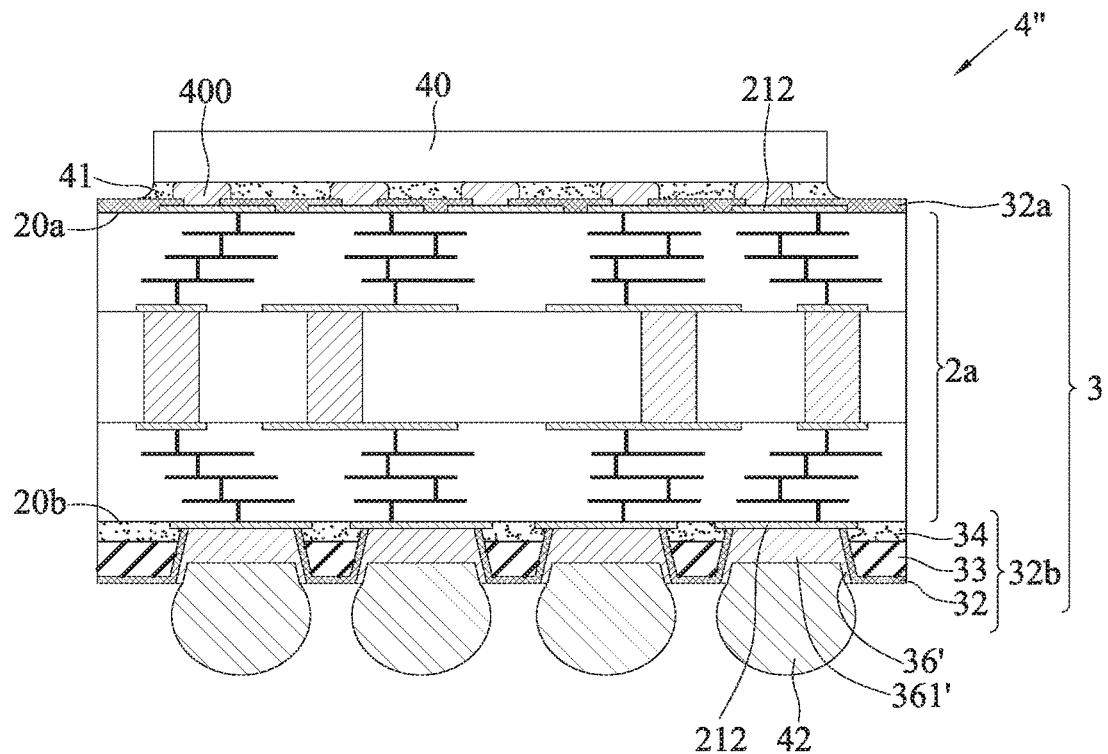

In the subsequent application, if the semiconductor packaging substrate 3 shown in FIGS. 3C and 3C' is adopted, the electronic package 4' shown in FIG. 3D will be formed. The electronic component 40 is disposed on the exposed solder pads 212 on the first side 20*a* of the circuit structure 2*a*, the encapsulating layer 41 is formed on the first side 20*a* and bonded to the electronic component 40, and the conductive elements 42 are mounted on the solder stands 36 having the conductively connecting block 37 on the second side 20*b* of the semiconductor packaging substrate 3.

If the semiconductor packaging substrate 3 of FIG. 3C" is adopted, the electronic package 4" shown in FIG. 3D' will be formed. The conductive elements 42 are mounted on the solder stand 36' having the bump bottom portion 361'.

In the method for fabricating the semiconductor packaging substrate 3 according to the present disclosure, a copper layer (i.e., forming the cup-shaped solder stands 36 and 36') is electroplated on the solder pads 212 on the ball planting side (the second side 20*b* of the circuit structure 2*a*) and the hole walls of the second holes 320 of the solder resist structure 32*b*, allowing the conductive element 42 (a solder tin ball) to be in contact with the bottom surface and lateral wall of the solder stands 36 and 36' during the subsequent ball planting process, to thereby increase the metal contact area and the bonding force between the conductive element 42 (solder tin ball) and the solder stands 36 and 36'. Compared with the prior art, the present disclosure increases the bonding force between the conductive element 42 and the solder stands 36 and 36', and ensures that the conductive element 42 will not be broken or fell off from the solder stands 36 and 36'.

The installation of the metal support layer 33 on the second side 20*b* of the circuit structure 2*a* improves the rigidity of the semiconductor packaging substrate 3. Compared with the prior art, the semiconductor packaging substrate 3 according to the present disclosure, when applied to a large-sized package, can still have high enough rigidity, even if being thinned. Therefore, during the subsequent high temperature process or the use of the product, the electronic package 4', 4" does not suffer from warpage, and can be well connected with the electronic component 40 or the circuit board.

When the semiconductor packaging substrate 3 is used in a large-sized package, and the number of layers of the built-up portion 21 of the circuit structure 2*a* is changed on demands, the circuit structure 2*a* may have warpage to any extent. The rigidity of the semiconductor packaging substrate 3 can be controlled by adjusting the thickness of the metal support layer 33 or by the material of the metal support layer 33. Therefore, the core layer 20 needs not be thickened, but can be thinned, or be omitted, and the warpage problem of the semiconductor packaging substrate 3 can still be solved.

With the cup-shape solder stands 36' having the bump bottom portions 361' (made of the same material as the circuit layer 211 and the solder pads 212, such as copper), the size and material of the conductive element 42 can be reduced effectively, the requirement of a fine spacing package can be met, and the electric quality of the semiconductor packaging substrate 3 can be optimized (by replacing a portion of the conductive element 42 made of tin with the bump bottom portion 361' made of copper having good electric quality).

In the semiconductor packaging substrate, the electronic package and methods for fabricating the same according to the present disclosure, the design of the solder stands 23, 36 and 36' increase the contact area of the conductive element 42 with metal, and increase the bonding force between the conductive element 42 (solder tin ball) and the solder stands 23, 36 and 36'. Therefore, the present disclosure can prevent the conductive element 42 from being broken or fell off from the solder stands 23, 36 and 36'.

The foregoing descriptions of the detailed embodiments are only illustrated to disclose the features and functions of the present disclosure and not restrictive of the scope of the present disclosure. It should be understood to those in the art that all modifications and variations according to the spirit and principle in the present disclosure should fall within the scope of the appended claims.

What is claimed is:

1. A semiconductor packaging substrate, comprising:
   a circuit structure having a circuit layer;
   a solder resist structure disposed on the circuit structure, wherein the solder resist structure further comprises a metal support layer bonded via a bonding material to the circuit structure and an insulating layer encapsulating the metal support layer, and wherein the solder resist structure has a plurality of holes penetrating through the bonding material, the metal support layer and the insulating layer, with a portion of the circuit layer exposed from the holes; and
   at least a solder stand being in a cup-shaped structure, formed via electroplating, and extending from an exposed surface of the circuit layer to a hole wall of the holes, wherein the solder stand and the circuit layer are made of same material.

2. The semiconductor packaging substrate of claim 1, wherein the solder resist structure is a single insulating layer.

3. The semiconductor packaging substrate of claim 1, further comprising a conductively connecting block disposed on the solder stand, wherein the conductively connecting block is a solder tin ball, and the holes are not completely filled with the solder tin ball.

4. The semiconductor packaging substrate of claim 1, wherein the solder stand has a bump bottom portion having an appropriate thickness and being in direct contact with the circuit layer, wherein the appropriate thickness is greater than half a depth of the holes and less than the depth of the holes.

5. An electronic package, comprising:
   the semiconductor packaging substrate of claim 1, wherein the circuit layer is formed on a first side and a second side opposing the first side of the circuit structure, and the solder resist structure is disposed on the second side of the circuit structure; and
   an electronic component disposed on the first side of the circuit structure and electrically connected to the circuit layer on the first side of the circuit structure.

6. A method for fabricating a semiconductor packaging substrate, comprising:
   providing a circuit structure having a circuit layer;
   forming a bonding material on the circuit structure;
   bonding a metal support layer on the bonding material, wherein the metal support layer is integrated with the circuit structure, and a plurality of holes are formed on the metal support layer to expose a portion of the circuit layer;
   forming an insulating layer on a surface of the metal support layer and on a hole wall and a bottom of the plurality of holes;
   removing the insulating layer on the bottom of the plurality of holes, with the circuit layer exposed from the holes; and
   forming in the holes at least a solder stand being in a cup-shaped structure, formed via electroplating, and extending from an exposed surface of the circuit layer to the hole wall of the holes, wherein the solder stand and the circuit layer are made of same material.

7. The method of claim 6, wherein the solder resist structure is a single insulating layer.

8. The method of claim 6, further comprising forming on the solder stand a conductively connecting block, wherein the conductively connecting block is a solder tin ball, and the holes are not completely filled with the solder tin ball.

9. The method of claim 6, wherein the solder stand has a bump bottom portion having an appropriate thickness via electroplating and being in direct contact with the circuit layer, wherein the appropriate thickness is greater than half a depth of the holes and less than the depth of the holes.

10. A method for fabricating an electronic package, comprising:
  providing the semiconductor packaging substrate of claim 1, wherein the circuit layer is formed on a first side and a second side opposing the first side of the circuit structure, and the solder resist structure is disposed on the second side of the circuit structure; and
  placing an electronic component on the first side of the circuit structure, and electrically connecting the electronic component to the circuit layer on the first side of the circuit structure.

\* \* \* \* \*